(12) United States Patent  (10) Patent No.: US 7,435,991 B2
Baer et al.  (45) Date of Patent: Oct. 14, 2008

(54) MICROMECHANICAL SENSOR

(75) Inventors: Hans-Peter Baer, Pfullingen (DE);
Arnim Hoechst, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 14 days.

(21) Appl. No.: 10/588,838

(22) PCT Filed: Dec. 20, 2004

(86) PCT No.: PCT/DE2004/002777

§ 371 (c)(1),
(2), (4) Date: Aug. 8, 2006

(87) PCT Pub. No.: WO2005/077815

PCT Pub. Date: Aug. 25, 2005

(65) Prior Publication Data

US 2007/0138581 A1    Jun. 21, 2007

(30) Foreign Application Priority Data

Feb. 11, 2004    (DE) .................. 10 2004 006 698

(51) Int. Cl.
*H01L 23/58* (2006.01)
(52) U.S. Cl. .................. 257/48; 257/415; 257/419; 257/E21.521
(58) Field of Classification Search .......... 257/415, 257/419, 467, 469, 48
See application file for complete search history.

(56) References Cited

U.S. PATENT DOCUMENTS 6,725,725 B1 * 4/2004 Werner et al. .................. 73/716
2003/0127699 A1 * 7/2003 Artmann et al. ............. 257/419

FOREIGN PATENT DOCUMENTS

DE    100 52 419    5/2002
WO    WO 03/016203    2/2003

* cited by examiner

*Primary Examiner*—Wai-Sing Louie
(74) *Attorney, Agent, or Firm*—Kenyon & Kenyon LLP

(57) ABSTRACT

A micromechanical sensor and a method for manufacturing same are described. A secure diaphragm restraint, independent of fluctuations in the cavern etching process due to the process technology, and a free design of the diaphragm are made possible by designing a suitable connection of the diaphragm in an oxide layer created by local oxidation. The micromechanical sensor includes, for example, a substrate, an external oxide layer formed in a laterally external area in the substrate, a diaphragm having multiple perforation holes formed in a laterally internal diaphragm area, a cavern etched in the substrate beneath the diaphragm, whereby the diaphragm is suspended in a suspension area of the external oxide layer which tapers toward connecting points of the diaphragm and the diaphragm is situated in its vertical height between a top side and a bottom side of the external oxide layer.

7 Claims, 2 Drawing Sheets

MICROMECHANICAL SENSOR

FIELD OF THE INVENTION

The present invention relates to a micromechanical sensor and a method for manufacturing same.

BACKGROUND INFORMATION

Micromechanical sensors having a diaphragm are used as radiation detectors, for example, for measuring infrared radiation in gas sensors or as pressure sensors. The micromechanical diaphragms are generally produced by etching a cavern from the back side of the machined wafer down to a dielectric layer by using potassium hydroxide (KOH) or tetramethylammonium hydroxide (TMAH). Several sensors are formed in one wafer and then separated by cutting the wafer.

More recent approaches begin with etching a cavern beneath the dielectric layer from the front side of the wafer. To do so, the layer is perforated to allow the etching medium such as chlorine trifluoride ($ClF_3$) to have access to the substrate material.

However, the etching front of the cavern is not smooth but instead has peaks due to the undercutting, which begins at the perforation. The diaphragm is put under tensile stress during the etching process to prevent bulging. The tension increases greatly at peaks in the etching front, which may result in cracks in the diaphragm. The development of local stress peaks during the etching process is hardly subject to regulation in particular because of the technically induced fluctuations. Therefore, damage may occur during manufacture, and a substantial portion of the sensors thus manufactured may be defective.

SUMMARY

An example micromechanical sensor according to the present invention and the example method for manufacturing same in particular may have the advantage that the diaphragm restraint no longer depends on the cavern etching process with its technically induced fluctuations.

In addition, the diaphragm restraint may be determined by the layout of the connecting plane of the external oxide layer. According to the present invention, an oxide layer, preferably a thermal oxide layer, is formed by a LOCOS (local oxidation of silicon) method and is subsequently used for restraint of the diaphragm formed during the etching process. It is therefore possible to produce almost any diaphragm shapes, e.g., circular, but also rectangular, e.g., square.

Due to the LOCOS method used according to the present invention, the diaphragm in the vertical direction is in the area of the thicker external oxide layer, i.e., between the top side and the bottom side of the external oxide layer. Thus, there is a symmetrical stress effect acting on the diaphragm during the cavern etching process. This central suspension results in a more uniform introduction of stress into the diaphragm; in addition, relatively flat oxide flanks may be formed advantageously in the suspension area of the diaphragm and may converge at an acute angle in a wedge shape or a triangular shape toward the diaphragm, resulting in an especially uniform introduction of stress in a manner that protects the diaphragm so that cracking is prevented during the etching process - at least for the most part.

Due to its central position in the finished sensor according to the present invention, the diaphragm is also situated in a more protected arrangement than is the case when it is provided on the top side of the sensor, as is generally the case with traditional etching techniques.

The example embodiment of the present invention is based on the surprising finding that LOCOS methods, which have so far been used only for producing integrated circuits, also offer advantages for the additional production of micromechanical diaphragms.

Thus, according to an example embodiment of the present invention, a reliable and inexpensive manufacturing method which involves a relatively low complexity and has relatively few rejects is made available along with a sensor that has a diaphragm in a protected arrangement, is largely free of damage and may be manufactured inexpensively.

A pressure sensor may be manufactured by subsequently closing the perforation holes in the diaphragm, for example. In addition, an infrared detector for use in a gas sensor may also be produced by applying a thermopile structure and an absorber layer.

The substrate is advantageously made of silicon, using an etching gas such as $ClF_3$, which selectively etches silicon.

BRIEF DESCRIPTION OF THE DRAWINGS

The present invention is explained in greater detail below on the basis of the accompanying drawing illustrating one embodiment. The figures illustrate successive steps in an example method according to the present invention for manufacturing a micromechanical sensor according to an example embodiment of the present invention.

DETAILED DESCRIPTION OF EXAMPLE EMBODIMENTS

Figure 1:
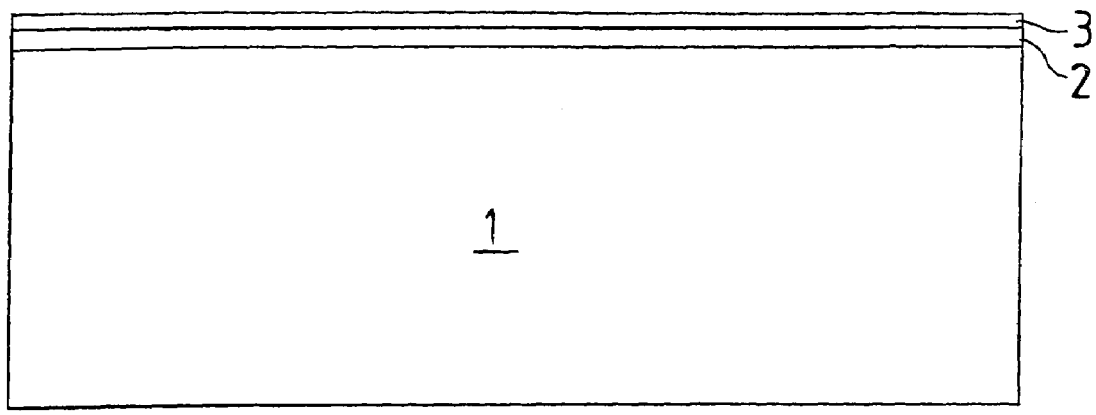
FIG. 1 shows a first step in the example manufacturing method according to the present invention after the creation of a silicon dioxide layer and a silicon nitride layer on a substrate.

A thin first silicon dioxide ($SiO_2$) layer 2 is formed by thermal oxidation on a substrate 1 made of silicon or silicon-germanium, and then a silicon nitride ($Si_3N_4$) layer 3 is deposited on this silicon dioxide layer subsequently by a CVD (chemical vapor deposition) process according to FIG. 1.

Figure 2:
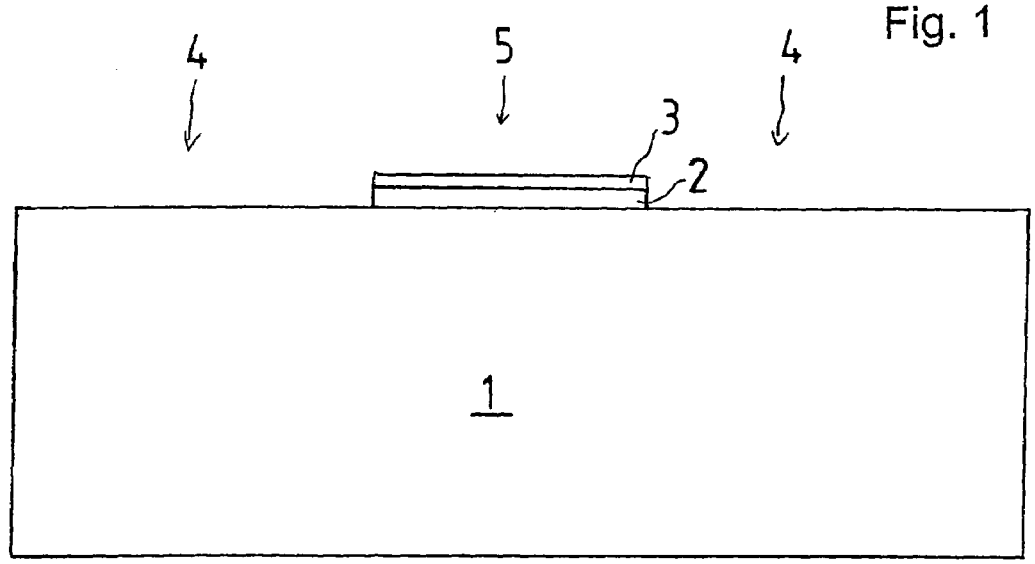
FIG. 2 shows the following step after photolithographic structuring.

In the following description, first silicon dioxide layer 2 and silicon nitride layer 3 are removed by a conventional photolithographic structuring in a laterally external area 4 around an internal diaphragm area 5 according to FIG. 2. Internal area 5 may generally assume any shape, e.g., it may be circular or rectangular.

Figure 3:
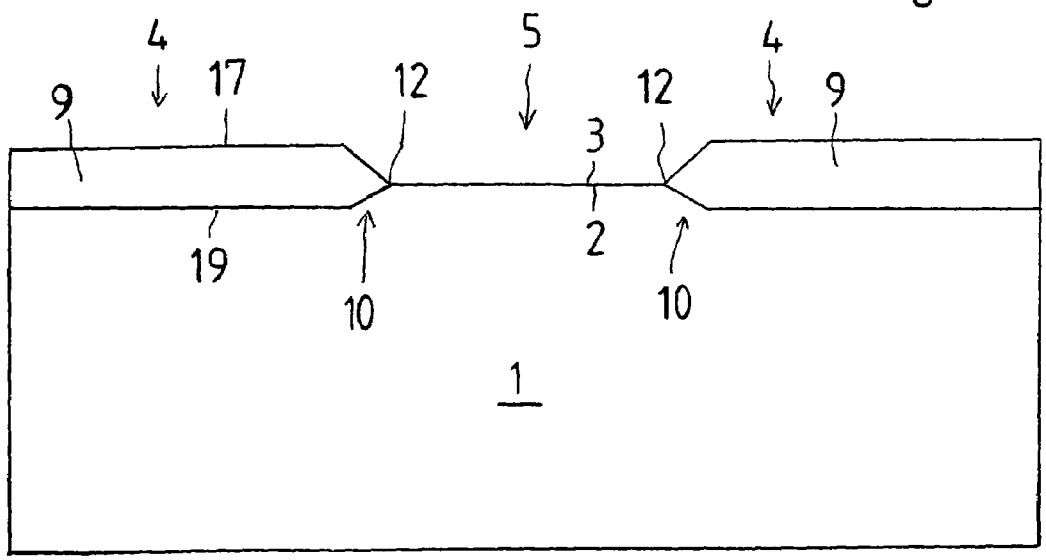
FIG. 3 shows a following step after local oxidation.

According to FIG. 3, a LOCOS structure is formed subsequently by local oxidation by creating a thicker second silicon dioxide layer 9 by thermal oxidation in external areas 4. FIG. 3 shows the diaphragm layer which forms the subsequent diaphragm and includes layers 2, 3 in simplified form, each having a relatively small thickness. Silicon nitride layer 3 prevents oxidation of substrate 1 in diaphragm area 5, so that second silicon dioxide layer 9 is not formed here. Second silicon dioxide layer 9 also protrudes partially downward into substrate 1 in comparison with diaphragm area 5. Therefore, a relatively flat LOCOS structure may be formed, the diaphragm layer formed from layers 2 and 3 being situated in a central area in the vertical direction of the thicker second silicon dioxide layer 9 between its top side 17 and its bottom side 19. A suspension area 10 is formed in second silicon dioxide layer 9 between external area 4 and diaphragm area 5, this suspension area tapering in cross section toward a connecting point 12 forming an acute angle, e.g., in the form of a wedge, a triangle or a bird's beak.

Optionally following FIG. 3, nitride layer 3 may be removed from diaphragm layer 2, 3 by a wet chemical process. The diaphragm layer may thus be formed by nitride layer 3 and internal oxide layer 2 or by internal oxide layer 2 alone. The additional deposition of extra layers on internal oxide layer 2 is then also possible to form a suitable diaphragm layer.

A cavern 14 is next etched beneath diaphragm area 5. To do so, diaphragm 15 formed by layers 2, 3 is first perforated in a conventional way by forming perforation holes 16 which allow the access of an etching gas, e.g., $ClF_3$ (chlorine trifluoride), which selectively etches silicon and protects diaphragm 15 and second silicon dioxide layer 9. Cavern 14 may be designed suitably as a function of the etching parameters, in particular the etching time, etching pressure and etching temperature, and extends according to FIG. 4 over suspension area 10 to approximately beneath second silicon dioxide layer 9. This forms a self-supporting diaphragm 15, which is suspended in acute connecting points 12 on second silicon dioxide layer 9.

Additional layers may be applied subsequently to manufacture a desired sensor. To create an infrared detector 20 for infrared radiation which may be used, for example, in a gas sensor for measuring gas concentrations, first a thermopile structure 18 having conductor areas 21, 22 of different conductive materials, e.g., a metal and polysilicon, which come in contact, e.g., overlap, in a contact area 23, may be subsequently applied to diaphragm 15. An absorber layer 25 may be applied subsequently to form a thermopile sensor 20 in which the incident infrared radiation results in heating of absorber layers 25, which is measurable as thermal e.m.f. by the thermopile structure of the two conductors.

Figure 4:
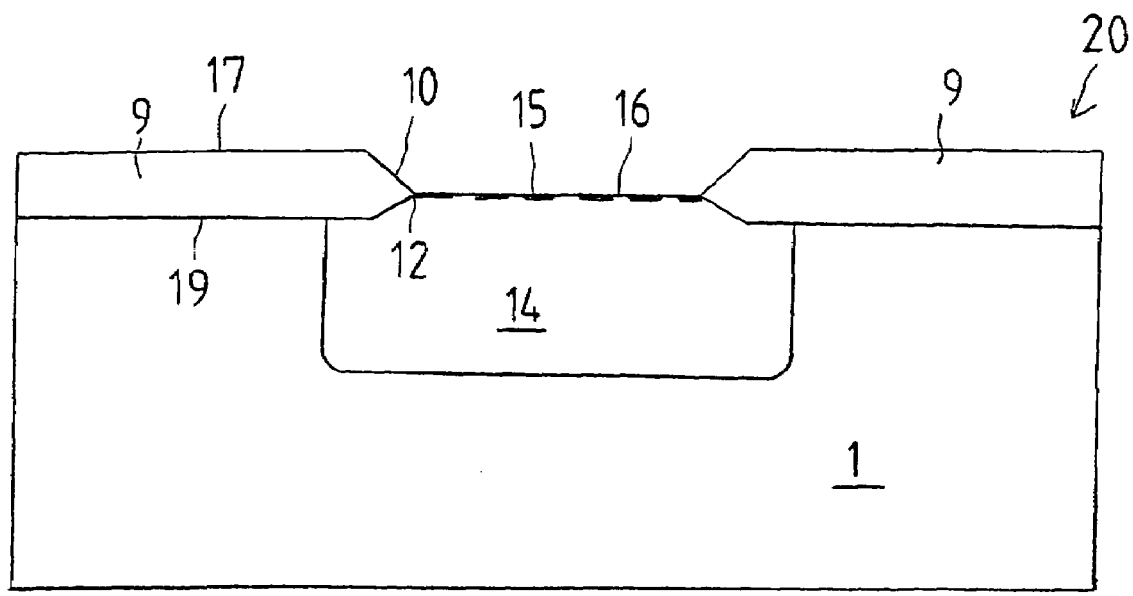
FIG. 4 shows a sensor according to an example embodiment of the present invention manufactured by a subsequent step of cavern etching.
Figure 5:
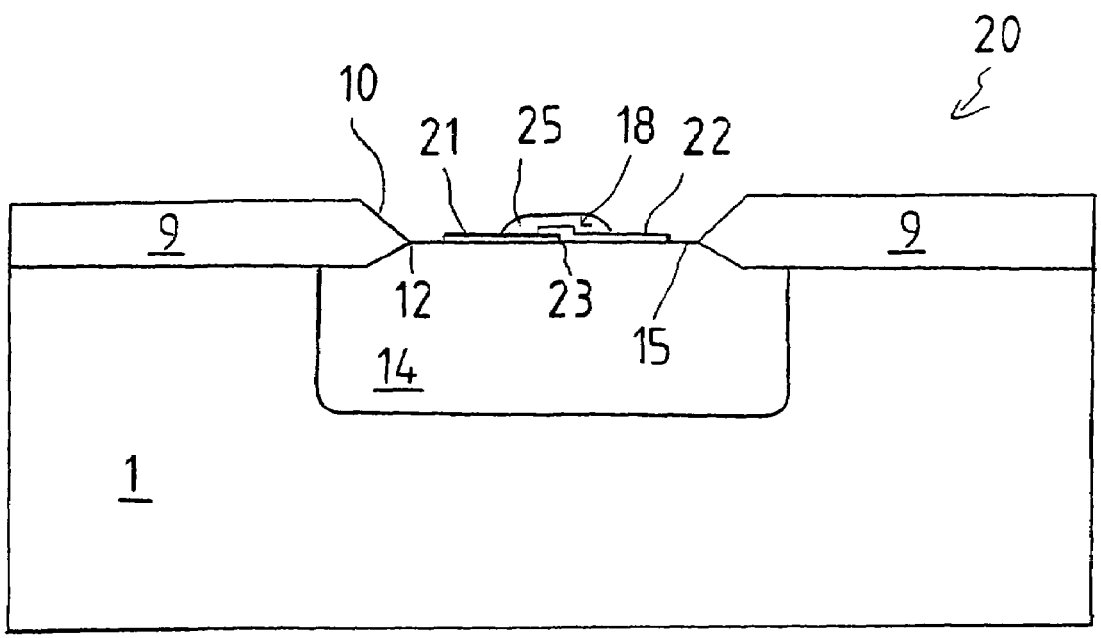
FIG. 5 shows an infrared detector as an example of a sensor according to an example embodiment of the present invention.

As an alternative to this, other micromechanical sensors may also be formed, e.g., a pressure sensor 20 may be formed after sealing perforation holes 16, e.g., by sputtering, according to FIG. 4.

Multiple sensors 20 are produced on one wafer and subsequently separated by cutting.

What is claimed is:

1. A micromechanical sensor, comprising:
a substrate;
an external oxide layer formed in a laterally external area in the substrate;
a diaphragm having multiple perforation holes formed in a laterally internal diaphragm area; and
a cavern etched in the substrate beneath the diaphragm;
wherein the diaphragm is suspended in a suspension area of the external oxide layer, which tapers toward connection points of the diaphragm, and the diaphragm is situated in its vertical height between a top side of the external oxide layer and a bottom side of the external oxide layer;
wherein the diaphragm is formed from an internal oxide layer.

2. The micromechanical sensor as recited in claim 1, wherein the external oxide layer tapers in the suspension area toward the connection points at an acute angle.

3. The micromechanical sensor as recited in claim 2, wherein the external oxide layer is one of wedge shape or triangular shape.

4. The micromechanical sensor as recited in claim 1, wherein the cavern extends to beneath the external oxide layer outside of the suspension area.

5. A micromechanical sensor, comprising:
a substrate;
an external oxide layer formed in a laterally external area in the substrate;
a diaphragm having multiple perforation holes formed in a laterally internal diaphragm area; and
a cavern etched in the substrate beneath the diaphragm;
wherein the diaphragm is suspended in a suspension area of the external oxide layer, which tapers toward connection points of the diaphragm, and the diaphragm is situated in its vertical height between a top side of the external oxide layer and a bottom side of the external oxide layer, and
wherein the diaphragm has an internal oxide layer and a nitride layer formed on the internal oxide layer.

6. The micromechanical sensor as recited in claim 1, wherein the diaphragm is rectangular or round.

7. The micromechanical sensor as recited in claim 1, wherein the diaphragm is situated approximately at a middle vertical height of the external oxide layer.

* * * * *